United States Patent [19]

Swanson et al.

[11] Patent Number: 4,933,649

[45] Date of Patent: Jun. 12, 1990

[54] COHERENT APERTURE FILLING OF AN ARRAY OF LASERS

[75] Inventors: Gary J. Swanson, Lexington; James R. Leger, Groton; Michael K. O. Holz, Newton Centre, all of Mass.

[73] Assignee: Massachusetts Institute of Technology, Cambridge, Mass.

[21] Appl. No.: 920,573

[22] Filed: Oct. 17, 1986

[51] Int. Cl.$^5$ .......................... H01S 3/08; H04B 9/00
[52] U.S. Cl. ................. 330/4.3; 350/162.24; 350/162.2
[58] Field of Search ........................ 330/4.3; 332/7.51; 350/162, 162.4, 168; 362/367, 244

[56] References Cited

U.S. PATENT DOCUMENTS

| | | | |
|---|---|---|---|
| 4,386,827 | 6/1983 | Scifres et al. | 350/356 |
| 4,410,237 | 10/1983 | Veldkamp | 350/162.2 |
| 4,649,351 | 3/1987 | Veldkamp et al. | 350/162.21 |
| 4,656,562 | 4/1987 | Sugino | 350/286 |

OTHER PUBLICATIONS

Leger et al., "Coherent Beam Addition . . . Gratings"; Appl. Phys. Lett., vol. 48, #14, pp. 888-890; 4/7/86.
Veldkamp, W. B., "Technique For Generating . . . Profiles"; Rev. Sci. Inst., vol. 53, #3, pp. 294-297, abst. only.
Veldkamp et al.; "High Efficieny Binary Lenses"; 4/15/85; Opt. Comm., vol. 53, #6, pp. 353-359.
Horner et al.; "Pattern Recognition . . . Filters"; Appl. Opt., vol. 24, #5, 3/1/85.
Veldkamp, W. B.; "Laser Beam Profile . . . Gratings;" Appl. Opt., vol. 21, #17, 9/1/82, pp. 3209-3212.
Veldkamp, W. B.; "Laser Beam Profile . . . Gratings"; Opt. Comm. ; vol. 38, #5,6, pp. 381-386, 9/1/81.
Swanson et al., "Binary Lenses . . . Micrometer"; Opt. Eng., vol. 24, #5, pp. 791-95, 96/10/85; abst. only.
Swanson et al.; "Binary Lenses .. . 10.6 mmm"; SPIE Int. (U.S.A.), vol. 523, pp. 244-250, 1/23/85; abst only.

Primary Examiner—Nelson Moskowitz

[57] ABSTRACT

A technique for coherent aperture filling by amplitude phase exchange is described which suppresses the far field side lobes of an array of lasers. The power contained in these side lobes is transferred to the central lobe so that it contains greater than 90% of the total array power. This is achieved by a field transformation which generates from the uniform phase and varying amplitude distribution of the input array a varying phase modulation with nearly uniform, i.e., aperture filled, amplitude distribution in the output beam. Far-field grating lobes from the nonuniformity in phase are then suppressed by an additional phase correcting element matched to compensate the phase modulation. In a preferred embodiment, the field transformation element, including a single step binary phase shifter flanked by a pair of lenses in an a focal imaging configuration, is followed by a binary phase grating for phase compensation.

23 Claims, 4 Drawing Sheets

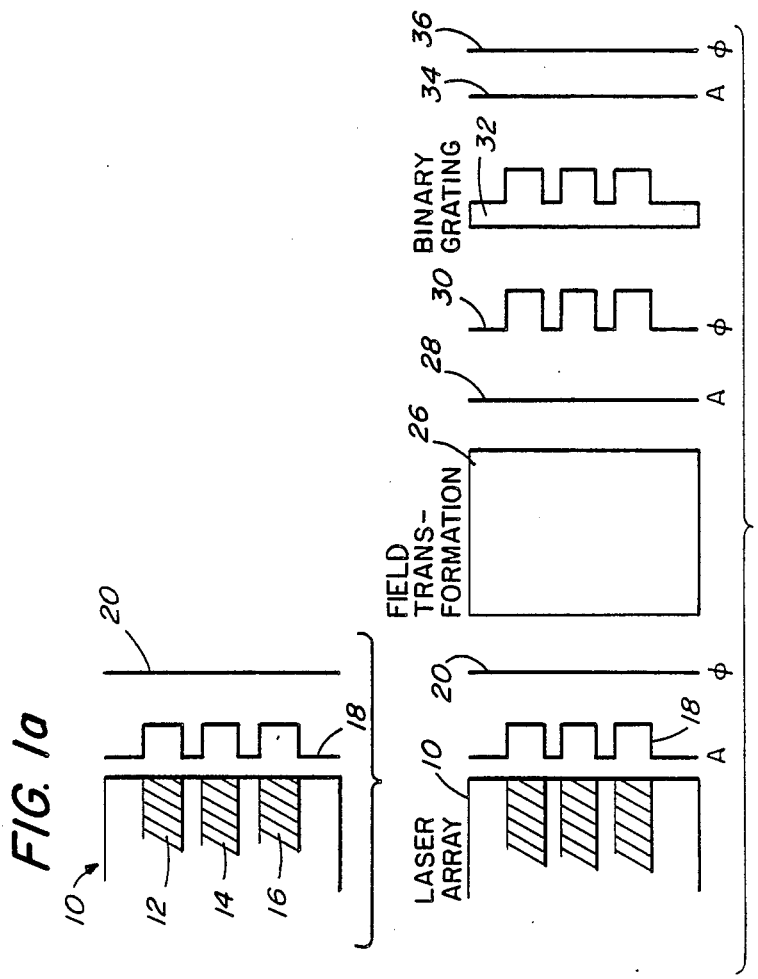

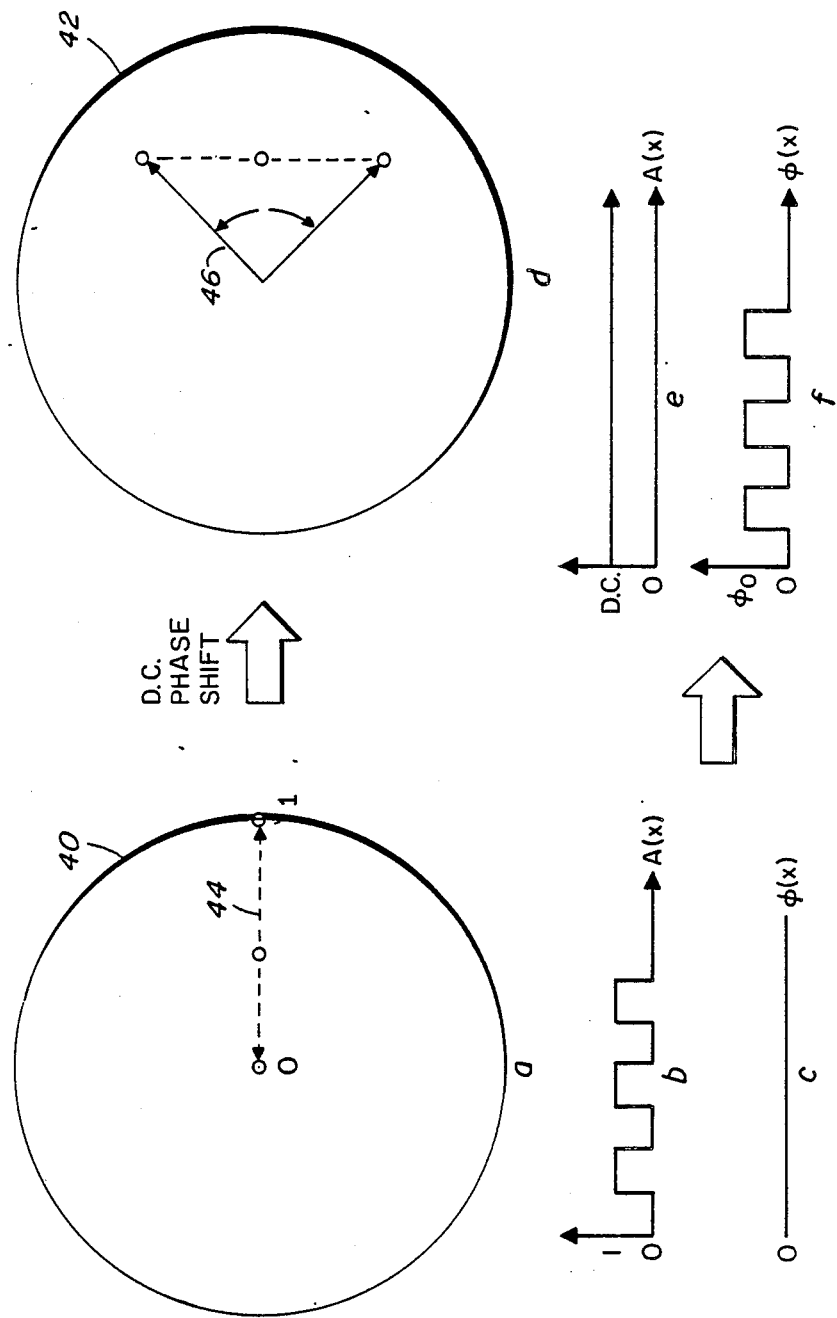
FIG. 3 FIELD TRANSFORMATION

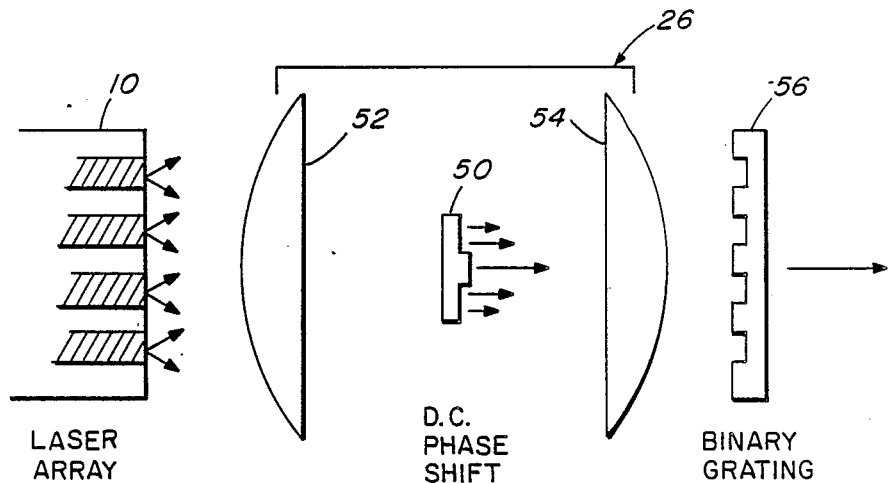
FIG. 4 OPTICAL CONFIGURATION FOR APERTURE FILLING
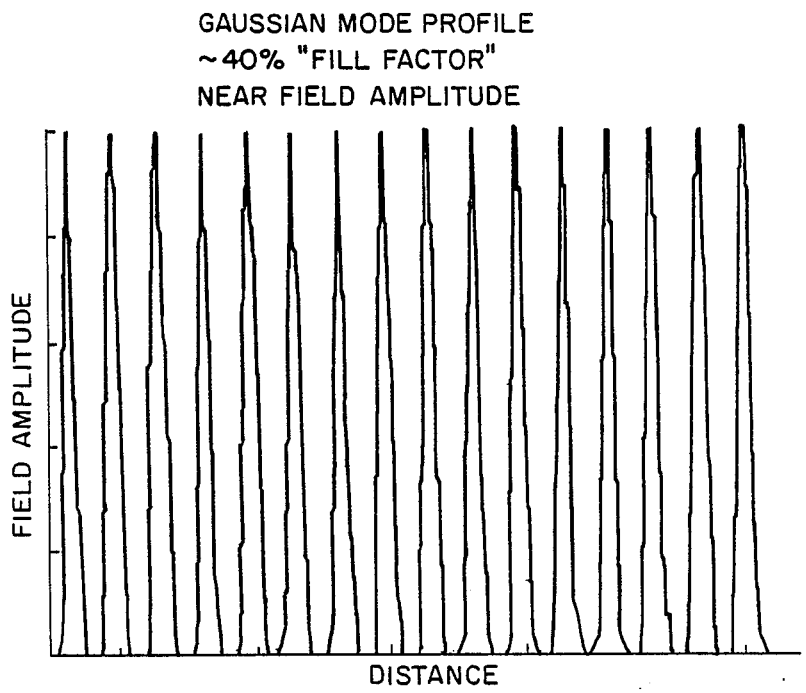
FIG. 5 16 ELEMENT GaAs ARRAY

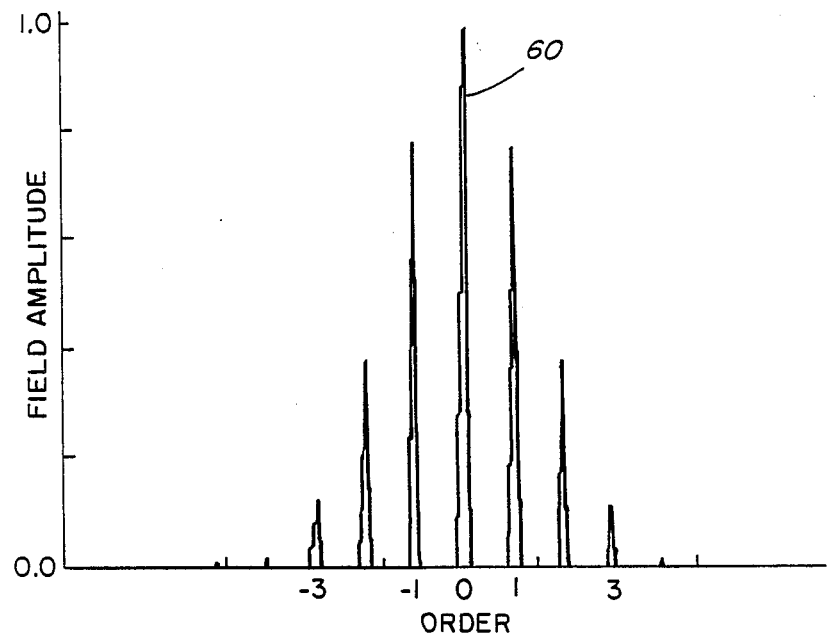
FIG. 6 FAR-FIELD AMPLITUDE — CENTRAL LOBE ENERGY 40%
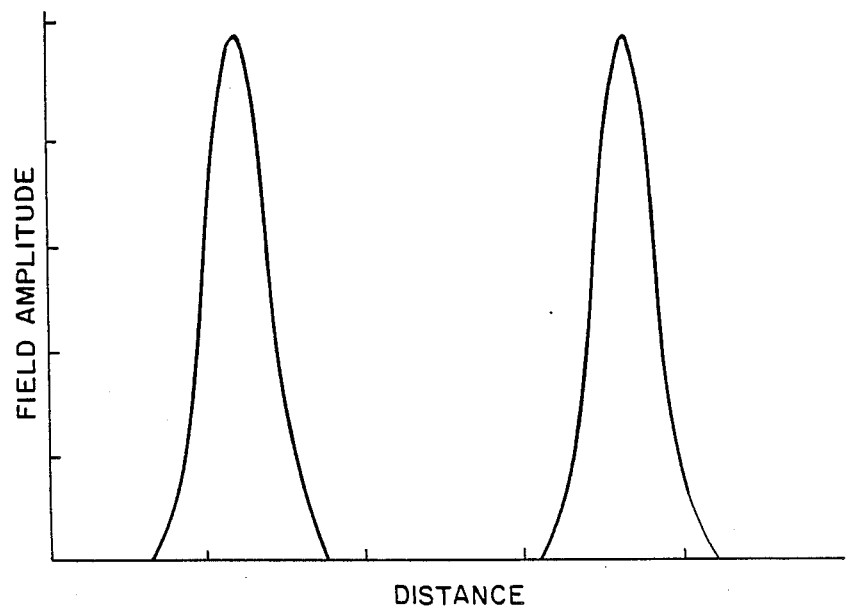
FIG. 7 PLOT OF E FIELD AMPLITUDE OF TWO OF THE LASERS

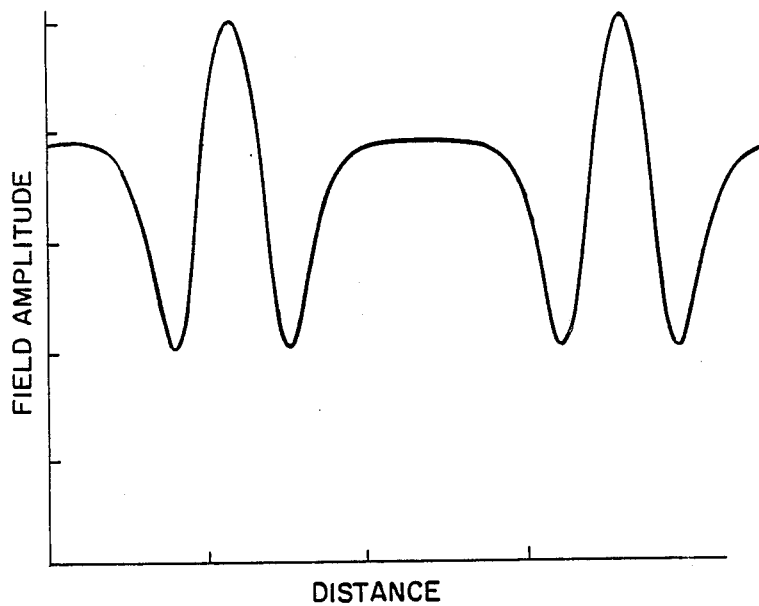
FIG. 8 PLOT OF E FIELD AMPLITUDE AFTER FIELD TRANSFORMATION
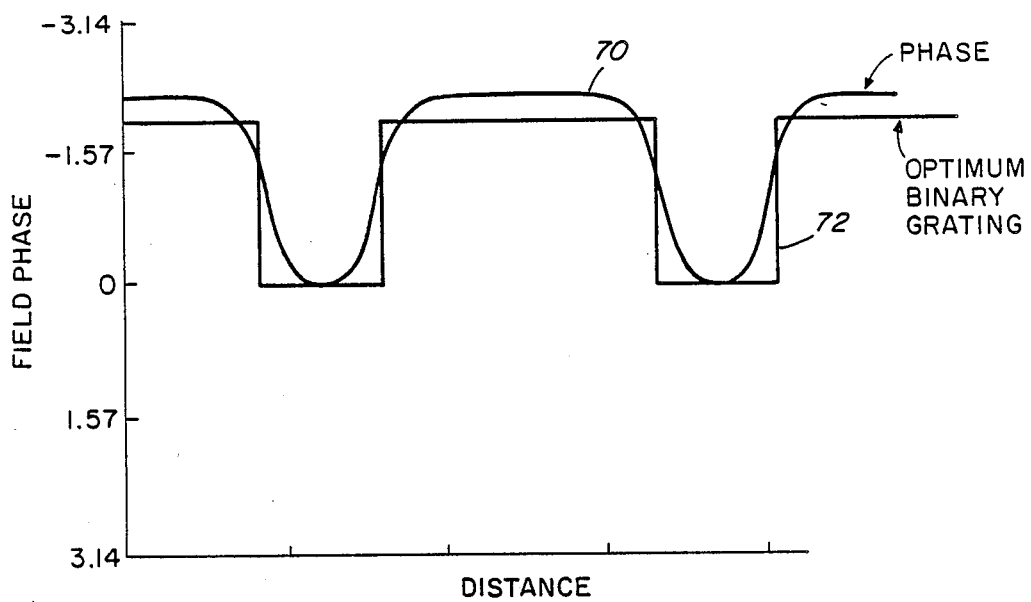
FIG. 9 PLOT OF E FIELD PHASE AFTER FIELD TRANSFORMATION

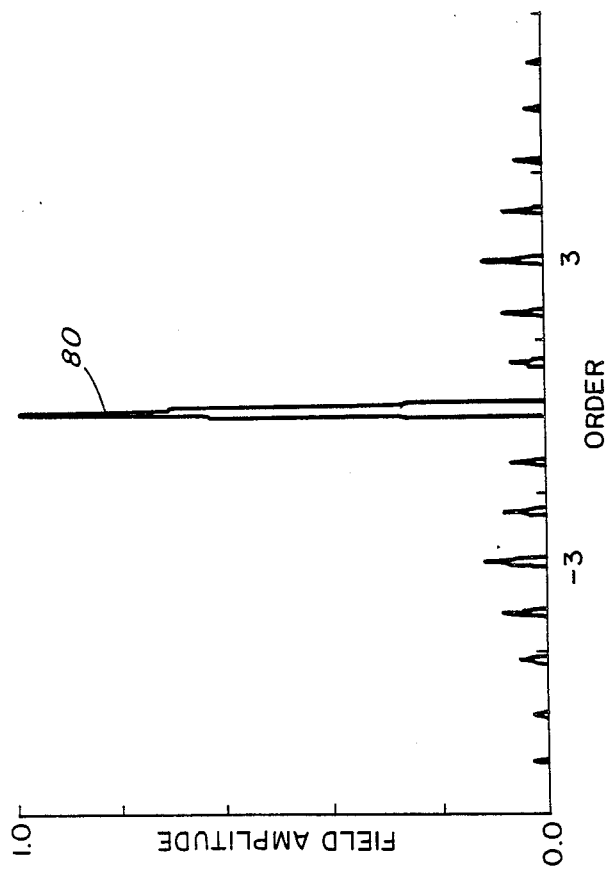
FIG. 10 APERTURE FILLED FAR-FIELD AMPLITUDE   CENTRAL LOBE ENERGY 91%
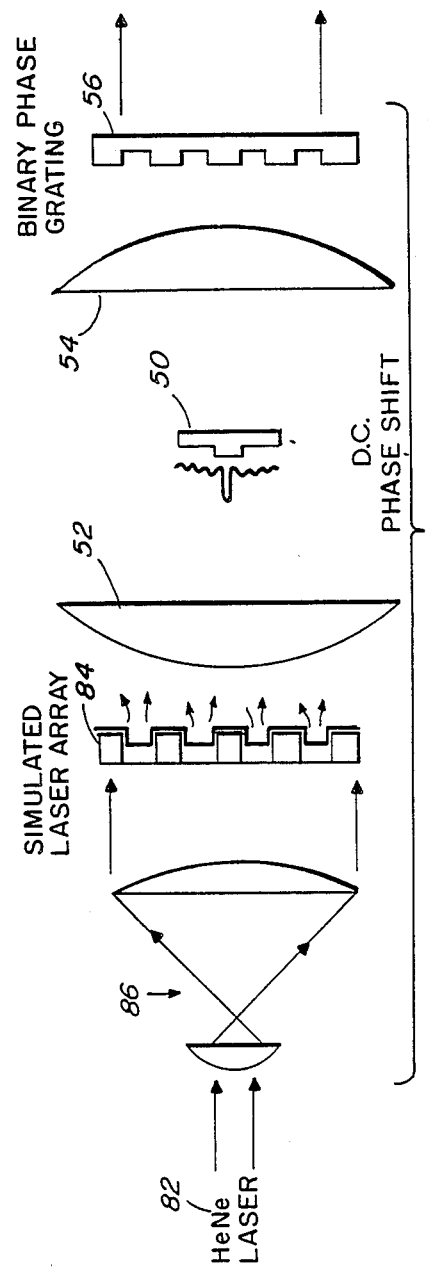
FIG. 11 EXPERIMENTAL SIMULATION   SIMULATED LASER ARRAY: 25% FILL FACTOR INTENSITY MASK

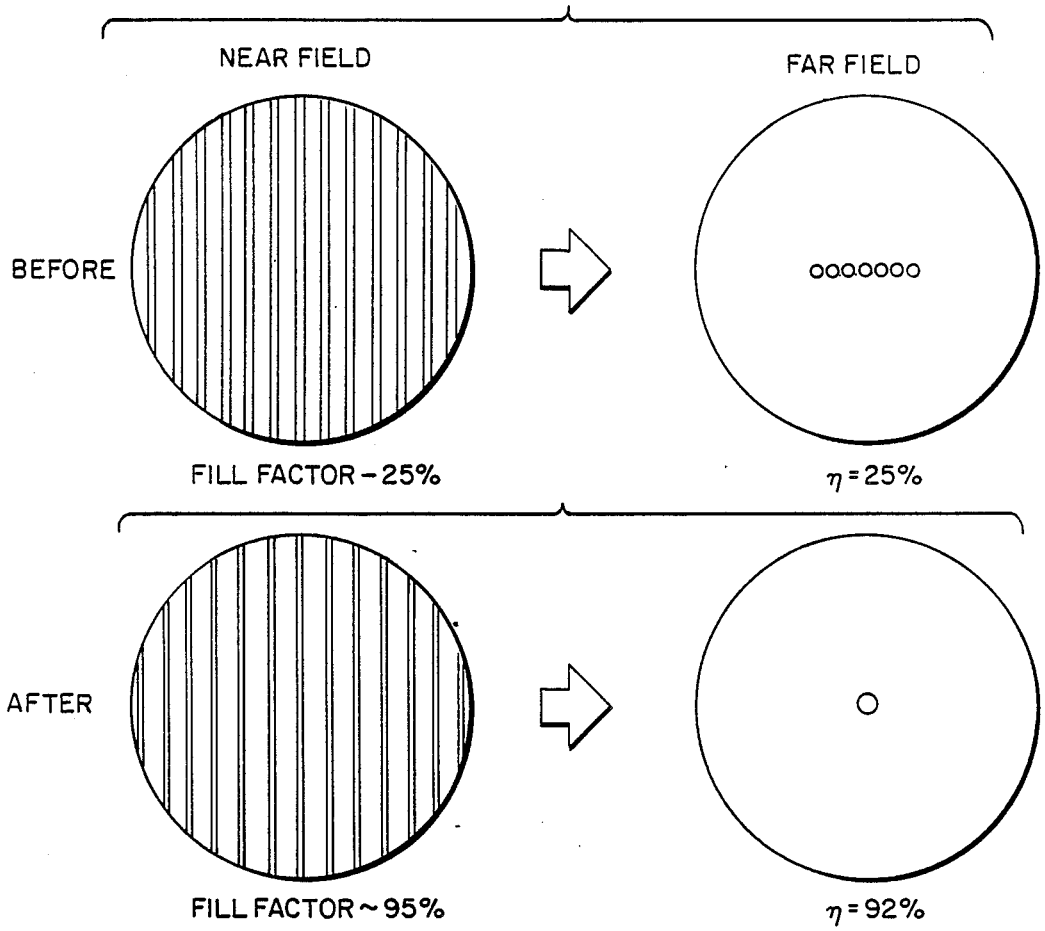
FIG. 12 APERTURE FILLING OF SIMULATED HeNe LASER ARRAY

COHERENT APERTURE FILLING OF AN ARRAY OF LASERS

BACKGROUND OF THE INVENTION

This invention relates to method and apparatus for combining the output of multiple lasers and, more particularly, to coherent aperture filling of coupled and uncoupled laser arrays. Here, aperture filling describes the process of transforming an array of closely spaced and parallel input beams into a single output beam which extends across the entire array and which maintains a uniform electric field amplitude and phase transversely. In the far field such an aperture-filled beam propagates with a dominant single-lobed transverse intensity distribution (weak side lobes given just by diffraction from the array exit aperture) as opposed to a strongly multi-loaded grating pattern generated by the separated beams of the laser array without aperture filling. Generally, such side lobes are to be avoided, since they reduce the energy in the central lobe. In addition, energy in the side lobes can be detrimental in certain applications.

A laser array, ideal in the sense of generating a single-lobed far-field pattern, would have all lasers in phase, exhibit uniform amplitude of the laser modes, and feature a 100% "fill factor". The "fill factor" is that fraction along the transverse length of the laser array where light is emitted. In actual coupled arrays, all of the lasers are in phase; but the amplitude of the laser modes are Gaussian (TEM00) or some other nonuniform distribution; furthermore, the fill factor must always be less than 100%, due to operational constraints, and typically is in the 25-75% range. For a coupled array having a 40% fill factor, for example, the far field distribution will have a central lobe energy of approximately 40%; the rest of the energy is distributed in the side lobes.

One technique, well-known in the art, for enhancing, in principle, the fill factor of a laser array is the precise placement of a matched lens system in front of each laser in the array such that individual output beams are collimated. This approach is, however, cumbersome, in particular for a large number of lasers in a small array, and, most importantly, cannot achieve the desirable 100% fill factor, due to boundary constraints at the lens edges and the nonuniform nature of the individual beams.

Another approach for achieving a high power laser beam is to superimpose coherently the output of plural lasers. In U.S. Ser. No. 662,609 issued Mar. 10, 1987 as patent No. 4,649,351, of which two of the present applicants are co-inventors, there is disclosed and claimed apparatus for the coherent addition of uncoupled arrays of lasers. As disclosed in that patent application, external feedback is required to lock together the phase of the individual lasers. The output according to the teachings of that patent application is a single laser beam having an 80-90% efficiency and a transverse dimension identical to that of a single laser of the array.

For the present aperture filling technique, to be described below, both uncoupled laser arrays with an external optical feedback cavity and phase-coupled laser arrays are applicable. There is no restriction on the spatial distribution of the lasers in the array: one-, two-, or even three-dimensional configurations can be accommodated, the latter three-dimensional case with the restriction that sufficient depth-of-field of the transform optics be provided; also, the individual laser elements need not be located in a regular array, nor have identical output apertures. The present aperture filling technique is also applicable for side lobe suppression of an angularly steerable beam emanating from a phased laser array.

Coupled laser arrays are presently being developed as one-dimensional arrays including plural closely spaced, coupled lasers in which the light from all of the lasers is in phase. Such phase-locked arrays are known for both gallium arsenide (evanescently coupled and Y-guide) diode lasers and $CO_2$ (ridged waveguide) gas lasers. For these lasers systems the amount of available optical output power from a single laser is restricted to an upper limit by physical constraints which cannot be circumvented. Thus the only alternative towards higher output levels is the combination of several gain or laser sections in multi-stage series or parallel array configurations.

It is therefore a principal object of this invention to provide apparatus for coherent aperture filling of laser arrays which highly suppresses side lobes in the far-field distribution.

Yet another object of the invention is such apparatus which results in over 90% of the energy being contained in the central lobe.

Still another object of this invention is such apparatus which can be readily implemented with existing fabrication techniques and which is applicable for both phase-locked and unlocked laser arrays.

SUMMARY OF THE INVENTION

These and other objects of the invention are achieved by a field transformation element for phase modulating light from the array of lasers by a specific amount. The phase shift is chosen such that the nonuniform amplitude, but uniform phase distribution of the input laser array is transformed into a uniform amplitude, but nonuniform phase distribution of the aperture-filled output beam. The specific value of phase shift is uniquely determined by the amplitude distribution of the laser modes, the fill factor, and the number of lasers in the array. A phase correcting element whose configuration is matched to fully compensate the nonuniform phase distribution of the light emanating from the field transformation element then passes light having suppressed side lobes in the far-field distribution. In a preferred embodiment, the field transformation element phase shifts the central diffraction lobe (DC component) of light from the array of lasers.

In practice the DC phase shift is applied by positioning a phase plate in the focal plane of an afocal imaging system. The transmissive phase plate is an optical flat except for a regionn with a specific step size matched to the transverse dimension of the central lobe. For the case of an unbounded laser array with a square-wave amplitude distribution, the depth of the step, d, as a function of fill factor, a, is given by the expression $$d = \frac{\text{lambda arccos}\,[(2a-1)/(2a)]}{2\,\text{pi}\,(n-1)},$$

where lambda is the wavelength of light and n the index of refraction of the phase plate material. A similar expression applies also for the case of a reflective phase plate. The depth of the final, phase correcting grating is also given by the above expression; its transverse layout is matched to the image of the array. Such complete phase compensation theoretically results in 100% efficiency for square-wave light sources with a fill factor greater than 25%. For Gaussian input beams at constant phase efficiencies of 97–98% are theoretically achievable. To find the value of step depth, d, for a finite number of arbitrarily shaped distributions an optimization can be performed using a computer model.

In a preferred embodiment, the field transformation element includes a single step binary phase shifter flanked by a pair of lenses, and the phase-correcting element is a binary phase grating. With this configuration central lobe efficiencies greater than 90% are readily achievable in practice. The field transformation need not be restricted to a phase shift of the DC component; the Fourier components in the focal plane may be modified by a general phase function. As an example, in another preferred embodiment, the field transformation is performed by a phase-shifting spot with a transverse dimension chosen smaller than the central diffraction lobe, preferably half the lobe size, but with a larger phase shift. This results in a slightly increased efficiency (1–2% improvement) and a more rectangular far-field lobe which is desirable for certain applications. It should be noted that the present aperture filling technique results in a diffraction limited far-field beam of diameter inversely related to the transverse dimension of the laser array and not to the transverse dimension of the individual lasers in the array. Therefore smaller diffraction spots are achievable without recourse to additional optical elements, such as beam expanders.

BRIEF DESCRIPTION OF THE DRAWING

The invention disclosed herein will be understood better with reference to the drawings of which:

FIG. 1a is an illustration of a coupled laser array showing the amplitude and phase distribution of its output;

FIG. 1b is a graphical illustration of the far-field distribution of light from the coupled laser array of FIG. 1a;

FIG. 2a is a schematic illustration of the invention disclosed herein;

FIG. 2b is a graph illustrating the far-field distribution resulting from the present invention;

FIG. 3 is a diagram illustrating the theory of operation of the present invention;

FIG. 4 is a diagramatic illustration of an implementation of the present invention;

FIG. 5 is a graph showing the near-field amplitude of a 16 element gallium arsenide laser array;

FIG. 6 is a graph of the far-field amplitude of the 16 element laser array of FIG. 5 illustrating the effect of 60% energy in the side lobes;

FIG. 7 is a graph of the E-field amplitude of two of the lasers of FIG. 5;

FIG. 8 is a plot of the E-field amplitude of two of the lasers for light emanating from the field transformation element; the effect of aperture filling is indicated by the broad central field component;

FIG. 9 is a graph of E-field phase of two of the lasers for light emanating from the field transformation element showing the actual phase variation and its optimal approximation by a binary phase grating;

FIG. 10 is a graph of the resultant aperture-filled far-field amplitude after phase compensation by the binary phase grating of FIG. 9;

FIG. 11 is a diagram illustrating an experimental simulation of the present invention;

FIG. 12 is a representation of a photographic record of the experimental simulation of FIG. 11;

DESCRIPTION OF THE PREFERRED EMBODIMENT

Figure 13:
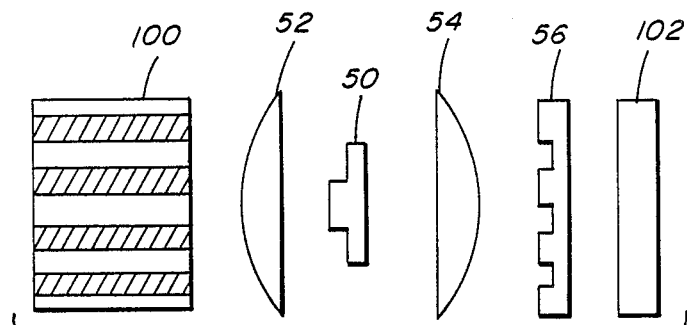
FIG. 13 is a diagrammatic illustration of an implementation of the present invention utilizing gain elements.
Figure 14:
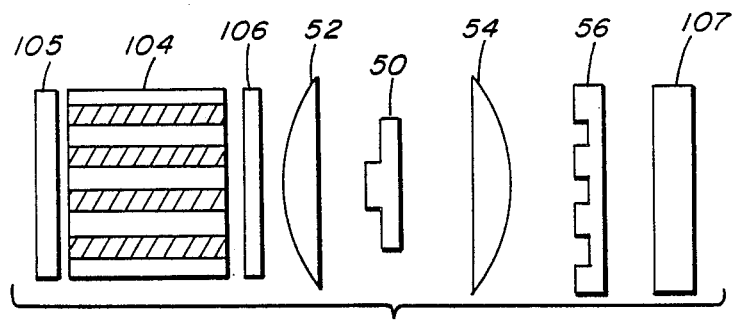
FIG. 14 is a diagrammatic illustration of an implementation of the present invention in which the array of lasers are configured as two, multiple-arm cavities.

The theory of operation of the present invention will now be described in conjunction with FIGS. 1, 2 and 3. In FIG. 1a, an exemplary coupled laser array 10 includes three closely spaced, evanescently coupled lasers 12, 14 and 16. Of course, three lasers are for illustration purposes only. In practice, the laser array 10 could include many more lasers. The amplitude variation across the laser array 10 is illustrated by curve 18. In reality, curve 18 would have a Gaussian (TEM00) or other nonuniform distribution, but is shown as rectangles for clarity. A line 20 denotes the phase distribution across the laser array 10 showing that the output of the array 10 is such that the light from the lasers 12, 14 and 16 is uniform in phase. The far-field distribution of light from the laser array 10 is schematically represented in FIG. 1b. Note that there is a central lobe 22 and smaller amplitude side lobes 24. The side lobes result from the non-uniform amplitude distribution of curve 18.

FIG. 2a illustrates the concept underlying the present invention. A field transformation element 26 interchanges the amplitude and phase distributions from the laser array 10. Thus, light emanating from the field transformation element 26 has an amplitude distribution shown by the constant line 28 and a nonuniform phase distribution shown by curve 30. Light from the field transformation element 26, having the amplitude and phase distributions shown by the curves 28 and 30, passes through a binary grating 32. The configuration of the binary grating 32 is compensatingly matched to the phase distribution 30 so that the light emanating from the binary grating 32 has the constant amplitude and phase distribution illustrated by the lines 34 and 36. FIG. 2b schetches the far-field distribution of the light emanating from the binary grating 32. This far-field distribution exhibits a central lobe 38 including most of the energy of the laser array.

In effect, the field transformation element 26, by interchanging the amplitude and phase distributions, has smoothed the amplitude distribution and disturbed what had been a uniform phase distribution. The binary grating 32 then smoothes the phase distribution resulting in an output in which both the amplitude and phase are substantially uniform. These operations are performed with completely passive elements and with no loss of energy. FIG. 3 is another illustration of the operation of the field transformation element 26. Circles 40 and 42 represent phase/amplitude diagrams. The diagram 40 represents light emanating from the laser array 10 before the DC phase shift produced by the field transformation element 26. As one proceeds across the array 10, the amplitude vector jumps from one to zero to one to zero, etc. while the phase remains constant. This is illustrated by the dashed line 44. After the phase shift, as shown in the diagram 42, the amplitude vector 46 has a constant length, but the phase jumps back and forth through 90°. These relationships are illustrated by the graphs in the lower portion of FIG. 3.

A physical implementation of the present invention will now be described in conjunction with FIG. 4. The field transformation element 26 includes a DC phase shift element 50 flanked by lenses 52 and 54 in an afocal configuration. As shown in the figure, the DC phase shift element 50 is a single step binary element. A more general, nonbinary phase shift element may be used. As will be appreciated by those versed in the art, the central step of the element 50 is either higher or lower than the surrounding flat portion by a distance corresponding to the desired phase shift and is located centrally on the optic axis to shift the phase of the central (DC) lobe of the diffraction pattern generated by lens 52. The function of the lens 52 is to image the far-field distribution of light from the laser array 10 to the focal plane of the lens. The DC phase shift element 50 is placed centrally aligned in the focal plane and modifies the phase distribution of the far field. Light passing through the phase shift element 50 is transformed back to the image plane of array 10 by lens 54 and passes through a binary grating 56, the configuration of which compensates the phase distribution of light which has been transformed by the phase shift element 50. The configuration of the binary grating 56 will be described more completely hereinbelow. Although a binary grating 56 is illustrated in FIG. 4, it should be understood that more general grating profiles (such as multi-level discrete, or continuous) may be utilized for even greater efficiencies. The binary grating 56 is preferred because binary gratings are readily fabricated using standard fabrication techniques. More general configurations can, however, be fabricated with present techniques.

As will be appreciated by those versed in the art, the physical implementation shown in FIG. 4, consisting of transmissive optical components, can be replaced by all reflective optical components of functional equivalence or any combination thereof.

FIG. 5 illustrates the near-field amplitude versus distance for a 16 element GaAs laser array before transformation according to the present invention. This near-field amplitude exhibits a Gaussian mode profile and has approximately a 40% fill factor. The far-field amplitude distribution of this laser array without transformation according to the present invention is shown in FIG. 6. Note that the central lobe 60 includes only approximately 40% of the energy, with the remaining energy distributed in the plural side lobes. FIG. 7 shows a plot of the E-field amplitude, in the near field, versus distance for two of the lasers of the array in FIG. 5. After passage through the field transformation element 26 (FIG. 4), the E-field amplitude of the system output has been altered as shown in FIG. 8, illustrating clearly the effect of aperture filling. Owing to the Gaussian mode profile, the amplitude distribution is not perfectly constant. Nevertheless, a comparison of the E-field amplitude before transformation, shown in FIG. 7, with the transformed E-field amplitude of FIG. 8 illustrates the substantial amplitude smoothing produced by the field transformation element 26.

The corresponding E-field phase after transformation is shown by the curve 70 in FIG. 9. Also shown in FIG. 9 is the configuration of the optimum binary grating 72. As can be seen, the binary grating 72 is matched to the phase distribution 70. It should be noted that a nonbinary grating having a configuration which more nearly matches the phase curve 70 would result in higher efficiencies although such a grating would be more difficult, though not impossible, to fabricate.

FIG. 10 shows the aperture filled far-field amplitude after transformation and passage through the binary grating 72. In this case, the central lobe 80 contains approximately 91% of the power of the original array, with the side lobes significantly suppressed in comparison with the original far-field amplitude shown in FIG. 6.

The present invention has been experimentally verified by a simulation conducted at the Lincoln Laboratory of the Massachusetts Institute of Technology. In this experiment (see FIG. 11), the output of a coupled laser array was simulated, utilizing a single helium-neon laser 82 which illuminated an element 84 after passing through beam expanding optics 86. The element 84 passed light only through the clear portions as shown, thus simulating the output of a coupled laser array, such as the array 10 of FIG. 1 or FIG. 4. Just as in the illustration of FIG. 4, light from the simulated laser array 84 passed through the lens 52 and was transformed by the DC phase shift element 50. After refraction by the lens 54 the transformed light passed through the binary phase grating 56.

FIG. 12 is a representation of a photographic record made of this experimental simulation. The circle in the upper left hand portion of FIG. 12 shows the near-field distribution of light emanating from the simulated laser array 84 before transformation. The fill factor is approximately 25%. The circle in the upper right hand portion of FIG. 12 shows the far-field distribution. Considerable side lobe energy is readily apparent. The circle in the lower left hand portion of FIG. 12 is the near-field output after passing through the binary phase grating 56 of FIG. 11. The fill factor has increased to approximately 95%. The far-field distribution is shown in the circle in the lower right hand portion of FIG. 12. The central lobe contains approximately 92% of the energy with side lobes being virtually unseen. In related experiments, aperture filling according to the teachings of this invention was achieved and demonstrated for a coupled GaAs Y-guide 10-element laser array (efficiency 90%) and for a coupled dual waveguide CO2 array (efficiency 94%).

Besides the advantage of maximal laser energy in the central far-field lobe, the output of the present invention has the advantage of low divergence because the output is spread over the length of the laser array.

An additional, important advantage of the present technique is the ability to modify the lineshape of the light of the far-field central lobe. By utilizing a phase spot (element 50 of FIG. 4 or 11) smaller than the central diffraction lobe, the resultant far-field central lobe is hard apertured at the sides with most of the clipped energy transfered to the central portion, thereby increasing the efficiency. In a preferred embodiment, a phase spot with a size of half the diameter of the diffraction spot was utilized. This feature was also reduced to practice using the Y-guide GaAs 10-element laser array.

The present invention works directly with arrays having a 25% fill factor or greater. Arrays having a fill factor between 10% to 25% can be accommodated utilizing two successive stages. That is, the output of a laser array having a low fill factor is passed through the structure of the present invention and this output is then transformed a second time to achieve a high fill factor and far-field lobe suppression. In principle, repeatedly applied stages can be used to realize complete aperture filling for arbitrarily small input fill factor. In practice, a combination of increasing the fill factor first to a value greater than 25% by a lens array followed by the present aperture filling technique may be advantageous.

Although this disclosure has emphasized the utility of the present invention with coupled laser arrays, the present invention will also work in an external cavity. There are two possibilities: The first case is illustrated in FIG. 13. Here, the laser array of FIG. 4 is modified by removing the respective output couplers (reflective mirrors), thereby reducing an array of gain elements 100. A common output coupler (mirror) 102 is placed to the right of the grating element 56 establishing common phase-coherent optical feedback for all gain elements of the array 100. In the second case, a laser array 104 retains its output couplers, intermediate output mirrors 105 and 106, perhaps at a modified transmission value, followed by the aperture filling system described above and a common feedback mirror 107 as in the case of FIG. 13. In this extended, multiple arm, 3-mirror cavity, the individual lasers of the array are coupled by the crosstalk established from the reflection of the second output mirror 107. As for the prior case of self-coupled laser arrays, the output beam of the external cavity-coupled arrays is aperture-filled over the transverse dimension of the array.

It is thus seen that the objects of this invention have been achieved in that there has been disclosed structure which greatly increases the energy in the central lobe of light emanating from laser arrays while significantly suppressing side lobe energy. The resulting beam also has low divergence as compared with other coherent addition techniques. It is recognized that modifications and variations of the present invention will occur to those skilled in the art and it is intended that all such modifications and variations be included within the scope of the appended claims.

What is claimed is:

1. Apparatus for suppressing the far-field side lobes of an array of lasers comprising:
   field transformation means for phase modulating light from the array of lasers to produce an aperture filled amplitude distribution; and
   phase grating means matched to the phase of the light emanating from the field transformation means to compensate for the phase modulation to suppress the side lobes thereby to concentrate substantially all the light from the array of lasers into a central lobe.

2. The apparatus of claim 1 wherein the array of lasers are used as an array of gain elements to form an external cavity, the cavity being a single, multiple-arm, cavity with one common output mirror.

3. The apparatus of claim 1 wherein the array of lasers form an external cavity, the cavity configured as two, multiple-arm, cavities with individual intermediate output mirrors followed by a second common feedback mirror.

4. The apparatus of claim 1 wherein the field transformation means phase shifts the central diffraction lobe (DC component) of the light from the array of lasers.

5. The apparatus of claim 1 wherein the field transformation means includes a single step binary phase shifter.

6. The apparatus of claim 5 wherein the transverse step size of the binary phase shifter is less than the size of the central diffraction lobe.

7. The apparatus of claim 5 wherein the step size of the phase shifter is approximately one-half the size of the central diffraction lobe.

8. The apparatus of claim 1 wherein the field transformation means includes a non-binary phase shifter.

9. The apparatus of claim 5 or 8 further including a pair of lenses flanking the phase shifter in an afocal configuration.

10. The apparatus of claim 1 wherein the compensating means is a binary phase grating.

11. The apparatus of claim 1 wherein the compensating means is a non-binary phase grating.

12. The apparatus of claims 1, or 2, or 3 wherein the field transformation means and the means for the phase modulation are either transmissive or reflective or any combination thereof.

13. The apparatus of claim 1 wherein the array of lasers has a fill factor greater than twenty-five percent.

14. The apparatus of claim 1 wherein the fill factor of the array of lasers is greater than ten percent and further including a second transformation stage.

15. The apparatus of claim 1 including a preprocessing stage consisting of a lens array system for collimating the array output.

16. The apparatus of claim 4 wherein the means of phase shifting the DC central lobe is restricted to an area less than the size of the central lobe to modify the light distribution in the resultant far-field central field.

17. Apparatus for suppressing the far-field side lobes of a coupled array of lasers comprising:
   a single step binary phase shifter flanked by pair of lenses in an afocal configuration for DC phase shifting light from the coupled array of lasers; and
   a binary phase grating for receiving light from the phase shifter matched to the phase of light emanating from the phase shifter thereby to suppress the side lobes thereby to concentrate substantially all the light from the array of lasers into a central lobe.

18. The apparatus of claim 1 wherein the array of lasers generates light having uniform phase.

19. The apparatus of claim 1 wherein the lasers in the array of lasers are coupled.

20. The apparatus of claim 1 wherein the compensating means is a continuous grating.

21. The apparatus of claim 1 wherein the compensating means is a multi-step approximation to a continuous grating.

22. The apparatus of claim 1 wherein the array of lasers is a phased laser array having an angularly steerable beam.

23. Apparatus for suppressing the far-field side lobes of an array of lasers comprising repeatedly applied stages, each stage including:
   field transformation means for phase modulating light from a preceding stage to produce an aperture filled amplitude distribution; and
   phase grating means matched to the phase of light emanating from the field transformation means to compensate for the phase modulation to suppress the side lobes thereby to concentrate substantially all the light from the array of lasers into a central lobe.

* * * * *

UNITED STATES PATENT AND TRADEMARK OFFICE
CERTIFICATE OF CORRECTION

PATENT NO.   : 4,933,649

DATED        : June 12, 1990

INVENTOR(S)  : Gary J. Swanson et al

It is certified that error appears in the above-identified patent and that said Letters Patent is hereby corrected as shown below:

Column 1, line 18:  Replace "multi-loaded" with --multi-lobed--.

Column 2, line 54:  Replace "regionn" with --region--.

Column 7, line 10:  Replace "reducing" with --rendering--.

Signed and Sealed this

Eighteenth Day of February, 1992

Attest:

HARRY F. MANBECK, JR.

*Attesting Officer*                    Commissioner of Patents and Trademarks